United States Patent
Teboulle (10) Patent No.: US 12,085,419 B2
(45) Date of Patent: Sep. 10, 2024

(54) MONITORING METHOD FOR MONITORING A SET OF METERS

(71) Applicant: SAGEMCOM ENERGY & TELECOM SAS, Rueil Malmaison (FR)

(72) Inventor: Henri Teboulle, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 472 days.

(21) Appl. No.: 16/987,728

(22) Filed: Aug. 7, 2020

(65) Prior Publication Data

US 2021/0041265 A1    Feb. 11, 2021

(30) Foreign Application Priority Data

Aug. 9, 2019   (FR) ...................................... 1909128

(51) Int. Cl.
*G01D 4/00*   (2006.01)
*G01F 15/00*   (2006.01)
(Continued)

(52) U.S. Cl.
CPC ........... *G01D 4/004* (2013.01); *G01F 15/007* (2013.01); *G01M 3/26* (2013.01); *G01R 22/066* (2013.01); *G06Q 50/06* (2013.01); *G01F 15/028* (2013.01)

(58) Field of Classification Search
CPC .... F17D 1/04; F17D 5/02; G01D 4/00; G01D 4/002; G01D 4/004; G01D 4/008;
(Continued)

(56) References Cited

U.S. PATENT DOCUMENTS

| | | | | |
|---|---|---|---|---|
| 5,910,774 A | * | 6/1999 | Capriotti | G01R 22/066 340/657 |
| 9,671,254 B2 | * | 6/2017 | Zigovszki | G01R 11/24 |
| 2007/0103335 A1 | * | 5/2007 | Fitzgerald | G01D 4/002 340/870.02 |
| 2009/0045976 A1 | * | 2/2009 | Zoldi | G08B 21/0484 340/870.02 |
| 2012/0007743 A1 | * | 1/2012 | Solomon | G01M 3/2807 702/51 |

(Continued)

FOREIGN PATENT DOCUMENTS

| | | | | |
|---|---|---|---|---|
| DE | 102011080618 A1 | * | 2/2013 | G01D 4/004 |
| JP | 08226835 A | * | 9/1996 | G01F 1/20 |

(Continued)

*Primary Examiner* — Stephen R Burgdorf
(74) *Attorney, Agent, or Firm* — MUNCY, GEISSLER, OLDS & LOWE, P.C.

(57) ABSTRACT

A method of monitoring a set of meters that are connected to a common remote processor device, the method comprising both first steps performed in each meter for: acquiring primary measurements of a magnitude representative of the occurrence of an anomaly; selecting pertinent measurements from the primary measurements, the pertinent measurements satisfying a pertinence criterion; regularly transmitting the pertinent measurements to the remote processor device; and second steps performed in the remote processor device, for: comparing, for each meter, the pertinent measurements with a detection threshold common to all of the meters of the set of meters in order to attempt detecting an anomaly associated with said meter; and adjusting the detection threshold dynamically as a function of the percentage of meters detected as being associated with an anomaly.

20 Claims, 1 Drawing Sheet

(51) Int. Cl.
  *G01M 3/26*  (2006.01)
  *G01R 22/06* (2006.01)
  *G06Q 50/06* (2024.01)
  *G01F 15/02* (2006.01)

(58) Field of Classification Search
  CPC ............ G01F 1/125; G01F 1/66; G01F 1/666;
      G01F 15/007; G01F 15/028; G01F
      15/063; G01F 25/10; G01F 25/15; G01H
      3/04; G01K 17/00; G01M 3/243; G01M
      3/26; G01M 3/28; G01M 3/2807; G01P
      21/025; G01R 11/24; G01R 19/2513;
      G01R 22/066; G01R 35/04; G05B
      23/0297; G06Q 50/06; Y02B 90/20;
      Y02B 90/246; Y04S 20/30
  USPC .................................................... 340/870.02
  See application file for complete search history.

(56) References Cited

U.S. PATENT DOCUMENTS

| 2015/0323344 | A1  | 11/2015 | Arlitt et al. |
| 2017/0063656 | A1* | 3/2017  | Vidyarthi ............ H04L 41/0631 |
| 2017/0082665 | A1* | 3/2017  | Bandyopadhyay .... G01R 22/10 |
| 2018/0023989 | A1* | 1/2018  | Droin ..................... G01F 15/007 73/861.04 |
| 2018/0052008 | A1* | 2/2018  | Maman ................. G06V 10/141 |
| 2018/0188210 | A1* | 7/2018  | Nielsen ................. G01D 4/002 |
| 2018/0230681 | A1* | 8/2018  | Poojary .................. E03B 7/072 |

FOREIGN PATENT DOCUMENTS

| JP | 5130220 B2      | 1/2013 |
| WO | WO-2015/089594 A1 | 6/2015 |
| WO | WO-2017/005269 A1 | 1/2017 |
| WO | WO-2018/162250 A1 | 9/2018 |

* cited by examiner

MONITORING METHOD FOR MONITORING A SET OF METERS

The invention relates to the field of smart meters: water, gas, electricity, etc. meters.

BACKGROUND OF THE INVENTION

So-called "smart" meters are presently being deployed very widely. The smart meters in question herein are used to measure a flow or stream supplied to an installation by a distribution network, the stream may be of any kind: water, gas, electricity, etc.

Such smart meters do not serve only to take measurements, they are also capable of performing a certain number of additional functions: e.g. managing rates by receiving orders, remote reading and programming, remote customer information, etc.

Smart meters are organized as genuine networks of meters that serve not only to convey uplink data that is transmitted by the meters to the supplier or to the manager of the network, but also to convey downlink data that is received by the meters. In conventional manner, each such network comprises a large number of meters that are connected to a common information system (IS), possibly via intermediate pieces of equipment such as data concentrators or gateways.

In such a network, it is essential to be able, both efficiently and reliably, to detect anomalies that might occur, and in particular faults happening in installations (e.g. leaks of water or of gas), or the meters being subjected to attempts at fraud. Specifically, one of the advantages of developing smart meter networks is to reduce as much as possible the need for operators of the supplier or of the network manager to intervene for the purpose of verifying that meters are operating properly.

It is therefore desired to make the detection of anomalies more robust, without that making meters more complicated, and while limiting the volume of data that is exchanged over the network in order to have the smallest possible impact on the electricity consumption of meters. This point is particularly critical for water or gas meters that are powered by one or more batteries having a lifetime without changing the battery(ies) that needs to be very long, typically equal to 20 years.

OBJECT OF THE INVENTION

An object of the invention is to improve the detection of anomalies occurring on meters or in installations to which said meters are connected, while limiting the exchanges of data that are needed to perform such detection, and without making meters more complicated.

SUMMARY OF THE INVENTION

In order to achieve this object, there is provided a monitoring method for monitoring a set of meters, each meter being arranged to measure a stream supplied to an installation by a distribution network, all of the meters being connected to a common remote processor device, the monitoring method comprising both first steps performed in each meter, for:

acquiring primary measurements of a magnitude representative of the occurrence of an anomaly associated with said meter;

selecting pertinent measurements from the primary measurements, the pertinent measurements satisfying a pertinence criterion;

regularly transmitting the pertinent measurements to the remote processor device; and second steps performed in the remote processor device, for:

comparing, for each meter, the pertinent measurements with a detection threshold common to all of the meters of the set of meters in order to attempt detecting an anomaly associated with said meter;

adjusting the detection threshold dynamically as a function of the percentage of meters detected as being associated with an anomaly.

By way of example, an anomaly associated with a meter is a fault in the installation associated with said meter (e.g. a leak), or else an attempt at fraud on said meter.

Thus, in the monitoring method of the invention, it is the remote processor device that acts dynamically to adjust the detection threshold for enabling an anomaly to be detected. This solution improves the accuracy and the robustness of detection, since the remote processor device is connected to all of the meters and can therefore evaluate statistically the detection results obtained by all of the meters, which a meter on its own is not capable of doing.

The invention is based on "edge computing" with respect to the meters. Each meter produces primary measurements and performs pre-processing on the primary measurements, consisting in selecting the measurements that are pertinent and in formatting them in order to transmit them regularly to the remote processor device, which in turn centralizes and analyzes the pertinent measurements.

Since the detection threshold is determined within the remote processor device, i.e. outside the meters, there is no need to return anomaly messages, since in accordance with the invention the anomalies are detected directly by the remote processor device. This serves to minimize the volume of data exchanged over the network and has very little impact on the electricity consumption of the meters.

It should also be observed that the above-described acquisition of primary measurements and their pre-processing do not require the meters to be reprogrammed regularly, thereby once again limiting the volume of data that is exchanged over the network. Furthermore, these operations are very simple and do not complicate the meter at hardware level or at software level.

Optionally, an anomaly associated with a meter is a fault in the installation associated with said meter or an attempt at fraud on said meter.

Optionally, the meters are fluid flow meters, and the fault that might potentially be detected in the installation is a leak of fluid in the installation.

Optionally, each meter comprises an ultrasonic measurement device for measuring a fluid speed, the magnitude representative of the occurrence of a leak is the speed Vmean of the fluid averaged over a first predetermined duration, and the pertinence criterion is the following condition:

$|Vmean| \leq Thresh\_V1$, where $|Vmean|$ is the absolute value of the averaged speed Vmean and where Thresh_V1 is a predetermined speed threshold.

Optionally, for each meter, the remote processor device detects a leak in the installation associated with said meter when, over a second predetermined duration, the following applies:

$N1 \geq K1$, where K1 is a predetermined leak threshold, and where N1 is the number of averaged speeds for which: $Vmean > Thresh\_V2$, where Thresh_V2 is the detection threshold.

Optionally, when the percentage of installations detected as being subjected to a leak is greater than a first predetermined leak percentage, the remote processor device increases the detection threshold so that the percentage of installations detected as being subjected to a leak becomes less than or equal to the first predetermined leak percentage.

Optionally, the magnitude representative of the occurrence of a leak is a count difference ΔC between a maximum value and a minimum value for a measurement count of the meter over a third predetermined duration, and the predetermined criterion is the following condition:
ΔC≤Thresh_C1, where Thresh_C1 is a predetermined count threshold.

Optionally, for each meter, the remote processor device detects a leak in the installation associated with said meter when, over a fourth predetermined duration, the following applies:
(ΔCmax−ΔCmin)≥Thresh_C2, where ΔCmax is the maximum value of the count difference ΔC, where ΔCmin is the minimum value of the count difference ΔC, and where Thresh_C2 is the detection threshold.

Optionally, when the percentage of installations detected as being subjected to a leak is greater than a second predetermined leak percentage, the remote processor device increases the detection threshold so that the percentage of installations detected as being subjected to a leak becomes less than or equal to the second predetermined leak percentage.

Optionally, the meters are fluid flow meters, each comprising an ultrasonic measurement device for measuring fluid speed, and an attempt at fraud that might potentially be detected is an attempt at ultrasonic fraud.

Optionally, the magnitude representative of the occurrence of an attempt at fraud is an interfering ultrasonic signal level measured while the ultrasonic measurement device is not emitting a measurement ultrasonic signal, and the pertinence criterion is such that the pertinent measurements comprise, over a fifth predetermined duration, a first predetermined number of interfering ultrasonic signal levels having the greatest absolute value.

Optionally, for each meter, the remote processor device detects an attempt at fraud when, over a sixth predetermined duration, the following applies:
N2≥K2, where K2 is a predetermined fraud threshold, and where N2 is the number of interfering ultrasonic signal levels Nc such that:
|Nc|>Thresh_Nc, where Thresh_Nc is the detection threshold.

Optionally, when the percentage of meters detected as being subjected to an attempt at fraud is greater than a first predetermined fraud percentage, the remote processor device increases the detection threshold so that the percentage of meters detected as being subjected to an attempt at fraud becomes less than or equal to the first predetermined fraud percentage.

Optionally, each meter includes a magnetometer for detecting an attempt at magnetic fraud.

Optionally, the magnetometer is a three-dimensional (3D) magnetometer, wherein the magnitude representative of the occurrence of an attempt at fraud is a magnetic magnitude equal to:
(|Bx|+|By|+|Bz|), Bx, By, and Bz being the values in teslas of a magnetic field measured along three axes X, Y, and Z, and the pertinence criterion is such that the pertinent measurements comprise, over a seventh predetermined duration, a second predetermined number of the values Bx, By, and Bz of the greatest magnetic magnitudes.

Optionally, for each meter, the remote processor device detects an attempt at fraud when, over an eighth predetermined duration, there is at least one value of the modulus B such that:
B>Thresh_B,
where Thresh_B is the detection threshold, and where:

$$B=\sqrt{B_x^2+B_y^2+B_z^2}.$$

Optionally, when the percentage of meters detected as being subjected to an attempt at fraud is greater than a second predetermined fraud percentage, the remote processor device increases the detection threshold so that the percentage of meters detected as being subjected to an attempt at fraud becomes less than or equal to the second predetermined fraud percentage.

Optionally, there is provided a measurement system comprising a set of meters and a remote processor device, each meter being arranged to measure a stream supplied to an installation by a distribution network, all of the meters being connected to the remote processor device, and the monitoring method as specified above being performed in said measurement system.

Optionally, there is provided a meter arranged to measure a stream supplied to an installation by a distribution network and to be connected to a remote processor device, the meter including a processor component in which the first steps of the monitoring method as specified above are performed.

Optionally, there is provided a computer program including instructions for enabling a processor component of a meter to perform the first steps of the monitoring method as specified above.

Optionally, storage means are provided storing a computer program including instructions for enabling a processor component of a meter to perform the first steps of the monitoring method as specified above.

The invention can be better understood in the light of the following description of a particular, nonlimiting embodiment of the invention.

BRIEF DESCRIPTION OF THE DRAWINGS

Reference is made to the following accompanying drawing.

DETAILED DESCRIPTION OF THE INVENTION

Figure 1:
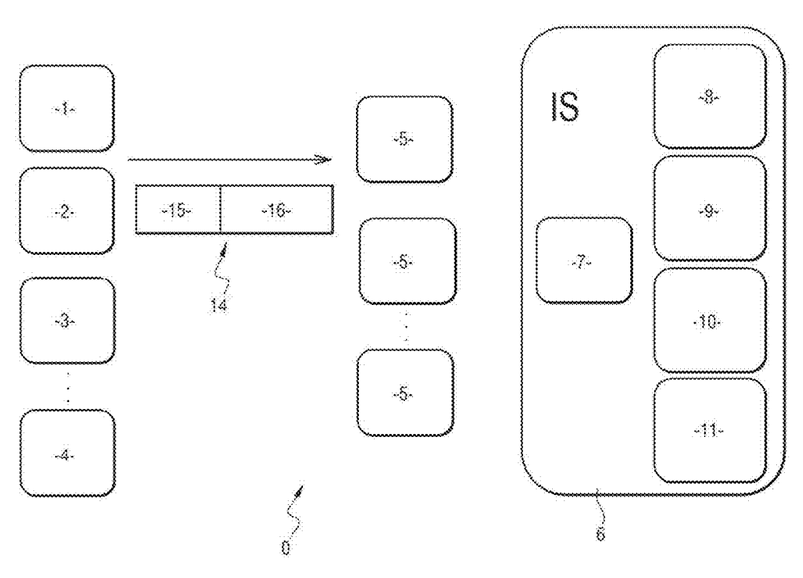
The sole FIGURE shows a measurement system comprising four sets of meters, gateways, and an information system.

With reference to the sole FIGURE, the invention is performed in this example in a system 0 that comprises a first set of meters 1, a second set of meters 2, a third set of meters 3, and a fourth set of meters 4. The system 0 also includes a plurality of gateways 5.

The system 0 also includes a remote processor device, which is specifically an information system (IS) 6.

The IS 6 comprises a long-range (LoRa) network server (LNS) 7 together with a first application module 8, a second application module 9, a third application module 10, and a fourth application module 11.

All of the meters are connected to the IS 6 via the gateways 5. The meters communicate with the IS 6 via a LoRa network. Naturally, some other type of radiofrequency network could be used, e.g. a network using a frequency band around 169 megahertz (MHz), or indeed any other low-power and long-range radiofrequency technology. The meters could also be connected to a remote processor device by other communication means: wired means, powerline carriers, etc.

With the LoRa network, use is made herein of an industry, science, and medical (ISM) band for transmitting uplink data from the meters to the IS 6, specifically the 863 MHz to 870 MHz band in Europe.

It should be observed that all of the meters that transmit in said ISM band then need to comply with a duty cycle of 0.1% (i.e. they do not transmit for more than 0.1% of the time, i.e. no more than 3.6 seconds (s) per hour).

Each meter has a processor component adapted to execute instructions of a program in order to perform the monitoring method of the invention. In this example, the processor component is a microcontroller, but it could be some other component, e.g. a microprocessor, a field programmable gate array (FPGA), an application-specific integrated circuit (ASIC), etc.

Attention is given initially to the meters of the first set of meters 1, which perform a first mode of monitoring and which communicate with the first application module 8 of the IS 6 via the gateways 5 and the LNS module 7.

The meters of the first set 1 are water meters, and each of them is arranged to measure a stream of water supplied to an installation by a distribution network.

Each of these meters comprises an ultrasonic water speed measuring device.

The ultrasonic measuring device comprises a duct, that is connected to a pipe connected to the distribution network, and through which water flows. The measuring device also includes a first transducer and a second transducer, which transducers are paired in frequency and in emission level. By way of example, the first transducer and the second transducer are piezoelectric transducers.

The first transducer emits a first emitted ultrasonic measurement signal into the duct, which signal travels along a path of defined length. The second transducer receives a first received ultrasonic measurement signal that results from the first emitted ultrasonic measurement signal propagating in the fluid. The travel time taken by the first emitted ultrasonic measurement signal to travel along the path of defined length from upstream to downstream is then measured.

Likewise, the second transducer emits a second emitted ultrasonic measurement signal into the duct. The first transducer receives a second received ultrasonic measurement signal that results from the second emitted ultrasonic measurement signal propagating in the fluid. The travel time taken by the second emitted ultrasonic measurement signal to travel along the path of defined length from downstream to upstream is then measured.

The speed V of the water is estimated on the basis in particular of the defined length of the path and of the difference between the travel times. The speed V of the water is an average speed for the water in the duct.

The meter regularly transmits frames to the IS 6, which frames contain the data that is conventionally transmitted by such a water meter. This data includes estimates of the flow rate of water being supplied to the installation, together with various other items of data.

In order to perform the monitoring method of the invention, in addition to transmitting these frames in conventional manner, the meter also transmits monitoring frames to the IS 6.

In this example, the meter sends 4 monitoring frames per day, i.e. once every 6 hours (h), it being understood that with a spreading factor of 12 (SF12=293 bits per second), the time taken to transmit a LoRa frame carrying a typical payload (frame (FRM) payload) of 51 bytes is about 2.5 s. These new monitoring frames thus represent a total duration of 2.5 s once every 6 h, which is relatively small compared with the above-mentioned duty cycle.

There follows a description of the content of the monitoring frames for each meter of the first set of meters 1.

The processor component of the meter produces primary measurements of a magnitude representative of the occurrence of an anomaly associated with the meter. In this example, an anomaly that might potentially be detected is a fault occurring in the installation, specifically a leak of water.

The magnitude representative of the occurrence of a leak is the speed Vmean of the water as averaged over a first predetermined duration, which in this example is equal to 15 minutes (min).

The processor component integrates the speed V of the water (which, as explained above, is itself an average speed of the water in the duct) as measured by the measurement device 8 times per second over 15 min, in order to obtain the averaged speed Vmean, which is an arithmetic average.

The averaged speed Vmean is then stored on 2 bytes.

The averaged speeds Vmean as acquired once every 15 min thus form the primary measurements.

Thereafter, the processor component selects pertinent measurements from among the primary measurements, which pertinent measurements satisfy a pertinence criterion. The processor component of the meter selects only those speeds that are averaged in a zero-flow situation, i.e. in a situation in which the equipment in the installation is not consuming water.

In this example, the pertinence condition is thus as follows:

|Vmean|≤Thresh_V1, where |Vmean| is the absolute value of the averaged speed Vmean and where Thresh_V1 is a predetermined speed threshold.

For a period of 6 h (i.e. 24×15 min), 48 bytes (out of 51) suffice for storing the speeds Vmean averaged over each 15 min period.

The processor component transmits these pertinent measurements to the IS 6 regularly, specifically once every 6 h.

It should be observed that the defined length L of the path between the first transducer and the second transducer of the ultrasonic measurement device, which is specific to each meter and is determined during calibration in the factory, is supplied to the IS 6 each time on one of the three remaining bytes.

The first application module 8 of the IS 6 receives the monitoring frames or, more precisely, monitoring packets 14. Each monitoring packet 14 comprises the address 15 of the meter that sent said monitoring packet together with a LoRa monitoring frame 16 that comprises a header specifying the first mode of monitoring in which the meter is operating (which meter belongs to the first set of meters 1), thereby enabling the monitoring packet 14 to be directed to the first application module 8.

For each meter, the first application module 8 compares the pertinent measurements with a first detection threshold that is common to all of the meters of the first set of meters 1, in an attempt to detect a leak of water in the installation associated with the meter.

For each meter in the first set 1, the IS 6 thus receives, once every 6 h, 24 averaged speeds Vmean relating to zero-flow periods.

The first application module 8 detects that there is a leak in the installation when, over a second predetermined duration that is equal to 6 h in this example, the following applies:

N1≥K1, where K1 is a predetermined leak threshold, and where N1 is the number of averaged speeds Vmean such that:

Vmean>Thresh_V2, where Thresh_V2 is the first detection threshold common to all of the meters in the first set of meters 1.

In this example, K1 is equal to 16.

Thus, if a positive bias is observed relating to the sign of these 24 averaged speed values Vmean, and if at least 16 of these 24 values satisfy:

Vmean>Thresh_V2;

then it is considered that there is a leak in the installation.

In this example, the first detection threshold Thresh_V2 is equal to 0.5 liters per hour (L/h).

The first application module 8 also adjusts the first detection threshold Thresh_V2 dynamically as a function of a detected anomaly percentage, i.e. a percentage of installations detected by the IS 6 as suffering a failure.

Specifically, the IS 6 receives periodically the monitoring frames as transmitted by all of the meters of the first set of meters 1 to which it is connected via the LoRa network.

When the percentage of installations suffering a leak is detected as being greater than a first predetermined leak percentage, the first application module 8 increases the first detection threshold Thresh_V2 so that the percentage of installations detected as suffering a leak becomes less than or equal to the first predetermined leak percentage.

Specifically, it is assumed that it is not possible to have more than F1% leaks simultaneously in all of the installations associated with the first set of meters 1.

F1 is the first predetermined leak percentage, and in this example it is equal to 8%.

Thus, if the first application module 8 detects more than 8% of installations leaking, that means that the first detection threshold Thresh_V2 is wrongly adjusted and is too low. The first application module 8 adjusts the first detection threshold Thresh_V2 dynamically in order to reduce the percentage of installations detected as suffering a leak so that it becomes less than or equal to 8%.

Attention is now given to the meters of the second set of meters 2, which perform a second mode of monitoring and which communicate with the second application module 9 of the IS 6 via the gateways 5 and the LNS module 7.

The meters of the second set 2 are gas meters, and each of them is arranged to measure the quantity of gas distributed to an installation by a distribution network.

Each of these meters comprises a measurement device that measures the volume of gas consumed and that increments a measurement count representative of the volume of gas consumed.

The meter regularly transmits frames to the IS 6, which frames contain the data that is conventionally transmitted by such a gas meter. This data includes measurement data representative of the quantity of gas distributed to the installation, e.g. the measurement count, together with various other items of data.

In order to perform the monitoring method of the invention, in addition to transmitting these frames in conventional manner, the meter also transmits monitoring frames to the IS 6.

Once again, in this example, the meter sends 4 monitoring frames per day, i.e. once every 6 h. These new monitoring frames thus represent a total duration of 2.5 s once every 6 h.

There follows a description of the content of the monitoring frames for each meter of the second set of meters 2.

The processor component of the meter produces primary measurements of a magnitude representative of the occurrence of an anomaly associated with the meter. In this example, an anomaly that might potentially be detected is a fault occurring in the installation, specifically a leak of gas.

The magnitude representative of the occurrence of a leak is a count difference $\Delta C$ between the two least significant bytes of a maximum value Cmax and the two least significant bytes of a minimum value Cmin for the measurement count C of the meter over a third predetermined duration. The measurement count C is measured once every second. In this example, the third predetermined duration is equal to 15 min.

The count difference $\Delta C$ is then stored on 2 bytes.

The count differences $\Delta C$ as acquired once every 15 min thus form the primary measurements.

Thereafter, the processor component selects pertinent measurements from among the primary measurements, which pertinent measurements satisfy a pertinence criterion.

The pertinence criterion is the following condition:

$\Delta C = (Cmax - Cmin) \leq Thresh\_C1$, where Thresh_C1 is a predetermined count threshold.

Typically, Thresh_C1=2.

The count differences $\Delta C$ that occur in a zero-flow situation are thus selected, i.e. those that occur in a situation in which the equipment of the installation is not consuming gas.

For a period of 6 h (i.e. 24×15 min), 48 bytes (out of 51) suffice for storing the count difference values $\Delta C$.

The processor component transmits these pertinent measurements to the IS 6 regularly, specifically once every 6 h.

The second application module 9 of the IS 6 receives the monitoring frames or, more precisely, monitoring packets 14. Each monitoring packet 14 comprises the address 15 of the meter sending it, together with a LoRa monitoring frame 16 that comprises a header specifying the second mode of monitoring in which the meter is operating (which meter belongs to the second set of meters 2), thereby enabling the monitoring packet 14 to be directed to the second application module 9.

For each meter, the second application module 9 compares the pertinent measurements with a second detection threshold that is common to all of the meters of the second set of meters 2, in an attempt to detect a leak in the installation.

For each meter of the second set 2, the IS 6 thus receives, once every 6 h, 24 count difference values $\Delta C$ relating to zero-flow periods.

The second application module 9 detects a gas leak in the installation associated with the meter when, over a fourth predetermined duration that is equal to 6 h, and thus over the 24 count difference values $\Delta C$, the following applies:

$(\Delta Cmax - \Delta Cmin) \geq Thresh\_C2$, where $\Delta Cmax$ is the maximum value of the count difference $\Delta C$ and where $\Delta Cmin$ is the minimum value of the count difference $\Delta C$ over the fourth predetermined duration, and where Thresh_C2 is the second detection threshold.

Typically, Thresh_C2=3.

The second application module 9 also adjusts the second detection threshold Thresh_C2 dynamically as a function of a detected anomaly percentage, i.e. a percentage of installations detected as suffering a leak.

Specifically, the IS 6 receives periodically the monitoring frames as transmitted by all of the meters of the second set of meters 2 to which it is connected via the LoRa network.

When the percentage of installations suffering a leak is detected as being greater than a second predetermined leak percentage, the second application module 9 increases the second detection threshold Thresh_C2 so that the percentage of installations detected as suffering a leak becomes less than or equal to the second predetermined leak percentage.

Specifically, it is assumed that it is not possible to have more than F2% leaks simultaneously in all of the installations associated with the second set of meters 2.

F2 is the second predetermined leak percentage, and in this example it is equal to 8%.

Thus, if the second application module 9 detects more than 8% of installations leaking, that means that the second detection threshold Thresh_C2 is wrongly adjusted and is too low. The second application module 9 adjusts the second detection threshold Thresh_C2 dynamically in order to reduce the percentage of installations detected as suffering a leak so that it becomes less than or equal to 8%.

Attention is now given to the meters of the third set of meters 3, which perform a third mode of monitoring and which communicate with the third application module 10 of the IS 6 via the gateways 5 and the LNS module 7.

The meters of the third set 3 are water meters, and each of them is arranged to measure a flow of water supplied to an installation by a distribution network.

Each of these meters comprises an ultrasonic water speed measuring device that includes a first transducer and a second transducer.

The meter regularly transmits frames to the IS 6, which frames contain the data that is conventionally transmitted by such a water meter. This data includes estimates of the flow rate of water being supplied to the installation, together with various other items of data.

In order to perform the monitoring method of the invention, in addition to transmitting these usual frames, the meter also transmits monitoring frames to the IS 6.

Once again, in this example, the meter sends 4 monitoring frames per day, i.e. once every 6 h. These new monitoring frames thus represent a total duration of 2.5 s once every 6 h.

There follows a description of the content of the monitoring frames for each meter of the third set of meters 3.

The processor component of the meter produces primary measurements of a magnitude representative of the occurrence of an anomaly associated with the meter. The anomaly that might potentially be detected is an attempt at ultrasonic fraud on the meter.

The magnitude representative of the occurrence of an attempt at fraud is an interfering ultrasonic signal level that is measured while the ultrasonic measurement device is not emitting a measurement ultrasonic signal via the first transducer or the second transducer.

Once every minute during periods of silence (i.e. when it is not emitting a measurement ultrasonic signal), the meter measures reception by each of its transducers of a received interfering ultrasonic signal level Nc. The interfering ultrasonic signal level Nc is a peak level.

The interfering ultrasonic signal level Nc is stored on 1 byte.

The interfering ultrasonic signal level values Nc thus form the primary measurements.

Thereafter, the processor component selects pertinent measurements from among the primary measurements, which pertinent measurements satisfy a pertinence criterion.

The pertinence criterion is such that over a fifth predetermined duration the pertinent measurements comprise a first predetermined number Np1 of interfering ultrasonic signal levels Nc having the greatest absolute values.

The first predetermined number Np1 is equal to 48, and the fifth predetermined duration is equal to 6 h.

Over a duration of 6 h, it is thus the 48 levels of the interfering ultrasonic signal Nc having the greatest absolute values that are selected.

The processor component regularly transmits these pertinent measurements to the IS 6, specifically once every 6 h.

The third application module 10 of the IS 6 receives the monitoring frames or, more precisely, monitoring packets 14. Each monitoring packet 14 comprises the address 15 of the meter sending it, together with a LoRa monitoring frame 16 that comprises a header specifying the third mode of monitoring in which the meter is operating (which meter belongs to the third set of meters 3), thereby enabling the monitoring packet 14 to be directed to the third application module 10.

For each meter, the third application module 10 compares the pertinent measurements with a third detection threshold common to all of the meters of the third set of meters 3, in an attempt to detect an attempt at fraud on the meter.

For each meter of the third set 3, the IS 6 thus receives, once every 6 h, the 48 interfering ultrasonic signal levels Nc having the greatest absolute values, which levels are measured during periods of silence of said meter.

The third application module 10 detects an attempt at fraud on the meter when, over a sixth predetermined duration, the following applies:

N2≥K2, where K2 is a predetermined fraud threshold, and where N2 is the number of interfering ultrasonic signal levels Nc such that:

|Nc|>Thresh_Nc, where Thresh_Nc is the third detection threshold.

In this example, K2 is equal to 16.

The sixth predetermined duration is equal to 6 h, and thus corresponds to the 48 received interfering ultrasonic signal levels Nc.

The third detection threshold is thus set in such a manner that if 16 interfering ultrasonic signal level values Nc have an absolute value strictly greater than the third detection threshold Thresh_Nc, it is assumed that fraud has occurred.

In this example, Thresh_Nc is equal to 0.5 V. Thresh_Nc depends on the design of the ultrasonic measurement device.

The third application module 10 also adjusts the third detection threshold Thresh_Nc dynamically as a function of the detected percentage of anomalies, i.e. the percentage of meters detected as being subjected to an attempt at fraud.

Specifically, the IS 6 receives periodically the monitoring frames as transmitted by all of the meters of the third set of meters 3 to which it is connected via the LoRa network.

When the percentage of meters detected as being subjected to an attempt at fraud is greater than a first predetermined fraud percentage, the third application module 10 increases the third detection threshold Thresh_Nc so that the percentage of meters detected as being subjected to an attempt at fraud becomes less than or equal to the first predetermined fraud percentage.

Specifically, it is considered that it is not possible to have more than F3% attempts at fraud simultaneously on all of the meters of the third set 3.

F3 is the first predetermined fraud percentage, and in this example it is equal to 10%.

Thus, if the third application module 10 detects more than 10% of the meters as suffering from attempts at fraud, that means that the third detection threshold Thresh_Nc is wrongly adjusted and is too low. The third detection threshold Thresh_Nc is adjusted dynamically in order to reduce the percentage of meters detected as being subjected to fraud so that it becomes less than or equal to 10%.

Attention is now given to the meters of the fourth set of meters 4, which perform a fourth mode of monitoring and which communicate with the fourth application module 11 of the IS 6 via the gateways 5 and the LNS module 7.

The meters of the fourth set 4 are gas meters, and each of them is arranged to measure the quantity of gas distributed to an installation by a distribution network.

Each meter is fitted with a 3D magnetometer for detecting an attempt at magnetic fraud.

The meter regularly transmits frames to the IS 6, which frames contain the data that is conventionally transmitted by such a gas meter. This data includes measurement data representative of the quantity of gas distributed to the installation, e.g. the measurement count, together with various other items of data.

In order to perform the monitoring method of the invention, in addition to transmitting these usual frames, the meter also transmits monitoring frames to the IS 6.

Once again, in this example, the meter sends 4 monitoring frames per day, i.e. once every 6 h. These new monitoring frames thus represent a total duration of 2.5 s once every 6 h.

There follows a description of the content of the monitoring frames for each meter of the fourth set of meters 4.

The processor component of the meter produces primary measurements of a magnitude representative of the occurrence of an anomaly associated with the meter. The anomaly that might potentially be detected is an attempt at magnetic fraud on the meter.

The magnitude representative of the occurrence of an attempt at fraud is the following magnetic magnitude:
|Bx|+|By|+|Bz|,
Bx, By, and Bz being the values in teslas of a magnetic field measured by the 3D magnetometer respectively along three Euclidean axes X, Y, and Z.

The processor component acquires a measurement of the magnetic magnitude as taken by the 3D magnetometer once every second.

The values Bx, By, and Bz of the magnetic magnitude thus form the primary measurements.

Thereafter, the processor component selects pertinent measurements from among the primary measurements, which pertinent measurements satisfy a pertinence criterion.

The pertinence criterion is such that the pertinent measurements comprise, over a seventh predetermined duration, a second predetermined number of the primary measurements having the greatest values, i.e. the values Bx, By, and Bz of the greatest magnetic magnitudes.

In this example, the second predetermined number Np2 is equal to 16, and the seventh predetermined duration is equal to 6 h.

The magnetic magnitudes that are selected are the 16 greatest magnitudes max(|Bx|+|By|+|Bz|) over a period of 6 h.

The processor component transmits the above-mentioned pertinent measurements, i.e. the values Bx, By, and Bz of the 16 greatest magnetic magnitudes, to the IS 6 regularly, specifically once every 6 h.

The fourth application module 11 of the IS 6 receives the monitoring frames or, more precisely, monitoring packets 14. Each monitoring packet 14 comprises the address 15 of the meter sending it, together with a LoRa monitoring frame 16 that comprises a header specifying the fourth mode of monitoring in which the meter is operating (which meter belongs to the fourth set of meters 4), thereby enabling the monitoring packet 14 to be directed to the fourth application module 11.

For each meter, the fourth application module 11 compares the pertinent measurements with a fourth detection threshold common to all of the meters of the fourth set of meters 4, in an attempt to detect an attempt at fraud on the meter.

For each meter of the fourth set 4, the IS 6 thus receives, once every 6 h, the respective values Bx, By, and Bz for each of the 16 greatest magnetic magnitudes, thus corresponding to 48 bytes that are transmitted to said IS 6.

For each received magnetic magnitude |Bx|+|By|+|Bz|, the fourth application module 11 then calculates the modulus B of the magnetic field, using the formula:

$$B=\sqrt{B_x^2+B_y^2+B_z^2}.$$

The fourth application module 11 detects that there has been an attempt at fraud on the meter when, over an eighth predetermined duration, the modulus B has had at least one value such that:
B>Thresh_B,
where Thresh_B is the fourth detection threshold.

The eighth predetermined duration is equal to 6 h, and thus corresponds to the 16 greatest magnetic magnitudes received by the IS 6.

Thus, the fourth application module 4 detects that there has been an attempt at magnetic fraud on the meter if at least one of the 16 values for B is such that B>Thresh_B.

The fourth application module 4 also adjusts the fourth detection threshold Thresh_B dynamically as a function of the detected percentage of anomalies, i.e. the percentage of meters detected as being subjected to an attempt at fraud.

Specifically, the IS 6 receives periodically the monitoring frames as transmitted by all of the meters of the fourth set of meters 4 to which it is connected via the LoRa network.

When the percentage of meters detected as being subjected to an attempt at fraud is greater than a second predetermined fraud percentage, the fourth application module 11 increases the fourth detection threshold Thresh_B so that the percentage of meters detected as being subjected to an attempt at fraud becomes less than or equal to the second predetermined fraud percentage.

Specifically, it is considered that it is not possible to have more than F4% attempts at fraud simultaneously on all of the meters of the fourth set 4.

F4 is the second predetermined fraud percentage, and in this example it is equal to 10%.

Thus, if the fourth application module 11 detects more than 10% of the meters as suffering from attempts at fraud, that means that the fourth detection threshold Thresh_B is wrongly adjusted and is too low. The fourth application module 11 adjusts the fourth detection threshold Thresh_B dynamically in order to reduce the percentage of meters detected as being subjected to fraud so that it becomes less than or equal to 10%.

Naturally, the invention is not limited to the embodiment described, but covers any variant coming within the ambit of the invention as defined by the claims.

It would naturally be possible to implement a plurality of modes of monitoring on the meters in a single set, e.g. a mode of monitoring for a fault in the installation and a mode of monitoring for an attempt at fraud.

The invention is not applicable only to water or gas meters, but can be implemented on meters of any type.

For example, it is thus possible to perform of the invention on heat meters that act in an apartment in a building to evaluate the heat energy consumed by the apartment by measuring the temperature difference between the inlet and outlet of the apartment's hot water pipe for providing heating by means of radiators.

The invention is also applicable to pipelines conveying oil or gas.

The invention may also be performed on electricity meters, which could then send a volume of data that is considerable.

It should be observed that the remote processor device could naturally make use of the "cloud" for subcontracting at least a portion of the algorithms.

The remote processor device need not necessarily be an IS, but could be some other equipment or system, e.g. a data concentrator connected to a set of meters.

Although as described above, the pertinent measurements for gas meters are the values Bx, By, and Bz, the pertinent measurements could be the magnetic magnitudes directly.

The invention claimed is:

1. A monitoring method for monitoring a set of meters, each meter being arranged to measure a stream supplied to an installation by a distribution network, all of the meters being connected to a common remote processor device, the monitoring method comprising both first steps performed in each meter, for:
    acquiring primary measurements of a magnitude representative of the occurrence of an anomaly associated with said meter;
    selecting pertinent measurements from the primary measurements, the pertinent measurements satisfying a pertinence criterion;
    regularly transmitting the pertinent measurements to the remote processor device;
    and second steps performed in the remote processor device, for:
    comparing, for each meter, the pertinent measurements with a detection threshold common to all of the meters of the set of meters in order to attempt detecting an anomaly associated with said meter;
    determining a percentage of meters detected as being associated with an anomaly among all of the meters;
    adjusting the detection threshold dynamically as a function of the percentage of meters detected as being associated with an anomaly,
    wherein, when the percentage of meters detected as being associated with an anomaly is greater than a first predetermined percentage, the remote processor device increases the detection threshold so that the percentage of meters detected as being associated with an anomaly becomes less than or equal to the first predetermined percentage.

2. The monitoring method according to claim 1, wherein an anomaly associated with a meter is a fault in the installation associated with said meter or an attempt at fraud on said meter.

3. The monitoring method according to claim 2, wherein the meters are fluid flow meters, and wherein the fault that might potentially be detected in the installation is a leak of fluid in the installation.

4. The monitoring method according to claim 3, wherein each meter comprises an ultrasonic measurement device for measuring a fluid speed, wherein the magnitude representative of the occurrence of a leak is the speed Vmean of the fluid averaged over a first predetermined duration, and wherein the pertinence criterion is the following condition:
    $|Vmean| \leq Thresh\_V1$, where $|Vmean|$ is the absolute value of the averaged speed Vmean and where Thresh_V1 is a predetermined speed threshold.

5. The monitoring method according to claim 4, wherein, for each meter, the remote processor device detects a leak in the installation associated with said meter when, over a second predetermined duration, the following applies:
    $N1 \geq K1$, where K1 is a predetermined leak threshold, and where N1 is the number of averaged speeds for which:
    $Vmean > Thresh\_V2$,
    where Thresh_V2 is the detection threshold.

6. The monitoring method according to claim 3, wherein the magnitude representative of the occurrence of a leak is a count difference $\Delta C$ between a maximum value and a minimum value for a measurement count of the meter over a third predetermined duration, and wherein the predetermined criterion is the following condition:
    $\Delta C \leq Thresh\_C1$, where Thresh_C1 is a predetermined count threshold.

7. The monitoring method according to claim 6, wherein, for each meter, the remote processor device detects a leak in the installation associated with said meter when, over a fourth predetermined duration, the following applies:
    $(\Delta Cmax - \Delta Cmin) \geq Thresh\_C2$, where $\Delta Cmax$ is the maximum value of the count difference $\Delta C$, where $\Delta Cmin$ is the minimum value of the count difference $\Delta C$, and where Thresh_C2 is the detection threshold.

8. The monitoring method according to claim 7, wherein, when the percentage of installations detected as being subjected to a leak is greater than a second predetermined leak percentage, the remote processor device increases the detection threshold so that the percentage of installations detected as being subjected to a leak becomes less than or equal to the second predetermined leak percentage.

9. The monitoring method according to claim 2, wherein the meters are fluid flow meters, each comprising an ultrasonic measurement device for measuring fluid speed, and wherein an attempt at fraud that might potentially be detected is an attempt at ultrasonic fraud.

10. The monitoring method according to claim 9, wherein the magnitude representative of the occurrence of an attempt at fraud is an interfering ultrasonic signal level measured while the ultrasonic measurement device is not emitting a measurement ultrasonic signal, and wherein the pertinence criterion is such that the pertinent measurements comprise, over a fifth predetermined duration, a first predetermined number of interfering ultrasonic signal levels having the greatest absolute value.

11. The monitoring method according to claim 10, wherein, for each meter, the remote processor device detects an attempt at fraud when, over a sixth predetermined duration, the following applies:
    $N2 \geq K2$, where K2 is a predetermined fraud threshold, and where N2 is the number of interfering ultrasonic signal levels Nc such that:
    $|Nc| > Thresh\_Nc$, where Thresh_Nc is the detection threshold.

12. The monitoring method according to claim 11, wherein, when the percentage of meters detected as being subjected to an attempt at fraud is greater than a first predetermined fraud percentage, the remote processor device increases the detection threshold so that the percentage of meters detected as being subjected to an attempt at fraud becomes less than or equal to the first predetermined fraud percentage.

13. The monitoring method according to claim 2, wherein each meter includes a magnetometer for detecting an attempt at magnetic fraud.

14. The monitoring method according to claim 13, wherein the magnetometer is a 3D magnetometer, wherein the magnitude representative of the occurrence of an attempt at fraud is a magnetic magnitude equal to:

(|Bx|+|By|+|Bz|), Bx, By, and Bz being the values in teslas of a magnetic field measured along three axes X, Y, and Z, and wherein the pertinence criterion is such that the pertinent measurements comprise, over a seventh predetermined duration, a second predetermined number of the values Bx, By, and Bz of the greatest magnetic magnitudes.

15. The monitoring method according to claim 11, wherein, for each meter, the remote processor device detects an attempt at fraud when, over an eighth predetermined duration, there is at least one value of the modulus B such that:

B>Thresh_B, where Thresh_B is the detection threshold, and where:

$$B=\sqrt{B_x^2+B_y^2+B_z^2}.$$

16. The monitoring method according to claim 15, wherein, when the percentage of meters detected as being subjected to an attempt at fraud is greater than a second predetermined fraud percentage, the remote processor device increases the detection threshold so that the percentage of meters detected as being subjected to an attempt at fraud becomes less than or equal to the second predetermined fraud percentage.

17. A measurement system comprising a set of meters and a remote processor device, each meter being arranged to measure a stream supplied to an installation by a distribution network, all of the meters being connected to the remote processor device, and the monitoring method according to claim 1 being performed in said measurement system.

18. A meter arranged to measure a stream supplied to an installation by a distribution network and to be connected to a remote processor device, the meter including a processor component in which the first steps of the monitoring method according to claim 1 are performed.

19. A computer program including instructions for enabling a processor component of a meter to perform the first steps of the monitoring method according to claim 1.

20. Storage means wherein they store a computer program including instructions for enabling a processor component of a meter to perform the first steps of the monitoring method according to claim 1.

* * * * *